(12) United States Patent
Ginetti et al.

(10) Patent No.: US 8,527,934 B2
(45) Date of Patent: Sep. 3, 2013

(54) METHOD AND SYSTEM FOR IMPLEMENTING GRAPHICALLY EDITABLE PARAMETERIZED CELLS

(71) Applicant: Cadence Design Systems, Inc., San Jose, CA (US)

(72) Inventors: Arnold Ginetti, Antibes (FR); Theodore A. Paone, Cedar Park, TX (US); Gerard Tarroux, Villeneuve-Loubet (FR); Jim Newton, Issy les Moulineaux (FR); Jean-Noel Pic, Valbonne (FR)

(73) Assignee: Cadence Design Systems, Inc, San Jose, CA (US)

( * ) Notice: Subject to any disclaimer, the term of this patent is extended or adjusted under 35 U.S.C. 154(b) by 0 days.

(21) Appl. No.: 13/692,960

(22) Filed: Dec. 3, 2012

(65) Prior Publication Data

US 2013/0097572 A1    Apr. 18, 2013

Related U.S. Application Data

(62) Division of application No. 12/878,893, filed on Sep. 9, 2010, now Pat. No. 8,347,261.

(60) Provisional application No. 61/241,325, filed on Sep. 10, 2009.

(51) Int. Cl.
G06F 17/50    (2006.01)

(52) U.S. Cl.
CPC ......... *G06F 17/505* (2013.01); *G06F 17/5072* (2013.01)
USPC ............ 716/132; 716/139; 716/119; 716/104

(58) Field of Classification Search
CPC .......................... G06F 17/505; G06F 17/5072
USPC .................. 716/132, 139, 119, 104
See application file for complete search history.

(56) References Cited

U.S. PATENT DOCUMENTS

| | | | |
|---|---|---|---|
| 6,530,065 B1 * | 3/2003 | McDonald et al. ........... | 716/102 |
| 2003/0052912 A1 * | 3/2003 | Bowman et al. ............. | 345/738 |
| 2005/0086615 A1 * | 4/2005 | Anand et al. ...................... | 716/1 |
| 2005/0165995 A1 * | 7/2005 | Gemelli et al. ............... | 710/305 |
| 2006/0253827 A1 * | 11/2006 | Karniewicz ..................... | 716/17 |
| 2008/0091402 A1 * | 4/2008 | Karunaratne .................. | 703/14 |
| 2008/0127024 A1 * | 5/2008 | Bowers et al. ................. | 716/12 |
| 2012/0198411 A1 * | 8/2012 | Bhushan et al. .............. | 716/139 |

* cited by examiner

*Primary Examiner* — Phallaka Kik
(74) *Attorney, Agent, or Firm* — Vista IP Law Group, LLP

(57) ABSTRACT

Disclosed is an improved mechanism and method for implementing electronic designs. According to some approaches, a method, mechanism, and compute program product is disclosed for implementing electronic designs that allows visual editing of complex objects with advanced editing features, which also provides for automated correspondence of the editing results to parametric values for a programmable object in the design.

22 Claims, 18 Drawing Sheets

Fig. 3B

```
pcDefinePcell(
  list(libId "SmartBased" "layout")     ← 320
  ((shapeType "polygon")                 ← 322
   (shapeData '((0 0) (0 1) (1 1) (1 0)))
  case(shapeType
    ("path" shape = dbCreatePath(pcCellView ("layer" "purpose") cds(shapeData)
  car(shapeData)))
    ("polygon" shape = dbCreatePolygon(pcCellView ("layer" "purpose") shapeData))
    ("rect" shape = dbCreateRect(pcCellView ("layer" "purpose" shapeData))
  )
  dbSetShape(shape t)
  ;; create maskable geometries based on model shape(s)
)
```

METHOD AND SYSTEM FOR IMPLEMENTING GRAPHICALLY EDITABLE PARAMETERIZED CELLS

CROSS-REFERENCE TO RELATED APPLICATIONS

This application constitutes a divisional patent application of U.S. patent application Ser. No. 12/878,893, now U.S. Pat. No. 8,347,261 which is entitled "METHOD AND SYSTEM FOR IMPLEMENTING GRAPHICALLY EDITABLE PARAMETERIZED CELLS", filed on Sep. 9, 2010, and claims the benefit of U.S. Provisional Application 61/241,325, filed on Sep. 10, 2009. The content of both the U.S. Patent Application and the U.S. Provisional Application is hereby expressly incorporated by reference for all purposes in its entirety.

COPYRIGHT NOTICE

A portion of the disclosure of this patent document contains material which is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The invention relates to the implementation of electronic designs, such as the design of Integrated Circuits (ICs).

BACKGROUND

Complex structures in an electronic design are often automatically generated from a set of parameters. "Guard rings" are examples of complex structures that may be formed based upon a programmable set of parameters that is used to create geometric objects in an electronic layout. A guard ring is a ring-like auxiliary circuit structure that is placed in a circuit to prevent negative electrical effects in the circuit. For example, guard rings are often used in CMOS circuit designs to address latchup problems for the electrical design.

A common example of an approach to implement such complex designs with parameters is to use parameterized cells (pcells). Pcells have been used for many years in designing full custom chip designs. The pcells are evaluated every time the design is opened. The highly dynamic nature of pcells introduces a level of variability that the design teams may want to control.

The pcell is associated with a set of parameters that may be programmed and/or set with values that, properly evaluated, allows the pcell to be instantiated into design elements on a circuit layout. The guard ring, for example, may be implemented using one or more pcells that have been programmed with the appropriate parameters to generate a guard ring instance when the parameters are properly evaluated.

While powerful when properly programmed or configured, the general problem with parameterized designs is that, conventionally, these designs may only be edited through those parameters. This approach provides a very effective programmatic way to edit the designs, but is not very intuitive when it is desired to visually modify shapes in the design.

One approach that can be taken is to use ROD MPP, e.g., ROD MPP guard rings. These guard rings can be edited like a shape. However, the problem is that these structures are not programmable and do not support advanced editing processes such as merging.

Therefore, there is a need for an advanced approach to implement electronic designs that allows for visual editing in combination with advanced editing methodologies while also allowing programmability for the design objects.

SUMMARY

The present invention provides an improved mechanism and method for implementing electronic designs. According to some embodiments of the invention, disclosed is a method, mechanism, and compute program product for implementing electronic designs that allows visual editing of complex objects with advanced editing features, which also provides for automated correspondence of the editing results to parametric values for a programmable object in the design.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE DRAWINGS

FIG. 3B shows an example function for defining pcells according to some embodiments of the invention.

DETAILED DESCRIPTION

Figure 1:
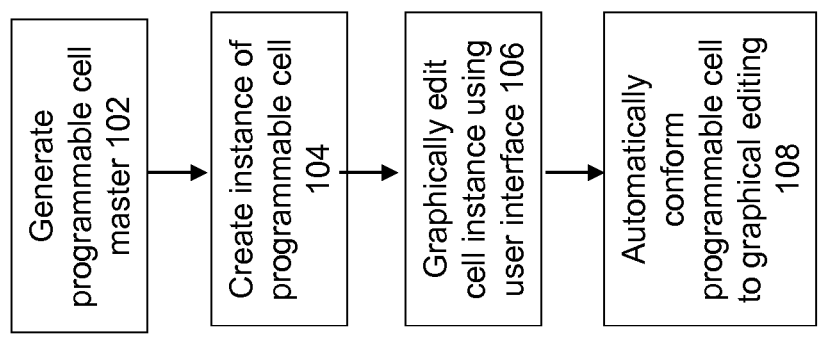
FIG. 1 shows a high level flow of a process for implementing the inventive approach according to some embodiments of the invention.

The present invention provides an improved mechanism and method for implementing electronic designs. According to some embodiments of the invention, disclosed is a method, mechanism, and compute program product for implementing electronic designs that allows visual editing of complex objects with advanced editing features, which also provides for automated correspondence of the editing results to parametric values for a programmable object in the design.

In a conventional approaches, the design editing tool (such as a layout editor) acts upon shapes and geometries in the design, without regard for or knowledge of any parameters or programs that might have been used to create those shapes or geometries. As such, it is impossible for a user to interactively and visually use the layout editor to make changes to design elements that are parametric or programmatic in nature. Therefore, with conventional approaches, the parametric or programmatic design elements could only be edited by directly editing the parameters or programs associated with the design elements.

The approach of the present invention allows a programmable or parametric design to be defined in a way that implements a pcell submaster having a shape (hereinafter referred to as either a "smart" shape and/or "fluid" shape) that is capable of being visually edited by a design editing tool or layout editor. An implementation function is used to specify the existence and identity of the smart shapes to the design editing tool. This function provides the layout editor with the necessary information to know about and be able to edit the smart shapes. Once the editing tool has been used by a user to edit the smart shape, an editing function is employed to make and propagate the corresponding changes to the programmable or parametric design elements or cells. In this way, a user can use familiar interfaces and controls in a layout editor to edit parametric shapes without requiring the layout editor to know about the specific parameters and details of those shapes.

The present invention is illustrated herein by way of examples with respect to pcells. It is noted, however, that the invention is applicable to any types of programmable or parameterized cells, and as such, is not limited to pcells unless claimed as such.

A pcell, or parameterized cell, has content which is dynamically created based on a set of parameters. The main attributes of a pcell are a piece of code in a given language, a list of parameter types and default value and an evaluator, e.g., with the language and evaluator being implemented in a programming language such as the SKILL, TCL, or Python languages. A pcell instance is an instance of a pcell, e.g., an instance decorated with pcell parameter values. Evaluating a pcell instance means evaluating the pcell code against the instance parameters with the help of the evaluator in order to produce a new non-persistent design with real data. This new design is referred to herein as a sub-master. Therefore, the pcell sub-master is a pcell variant that contains the results of the evaluation of the pcell implementation function against pcell instance parameter values. Evaluating a pcell instance means creating a pcell sub-master and filling it with the evaluation of the pcell implementation function against the pcell instance parameters.

FIG. 1 shows a high level flow of a process for implementing the inventive approach according to some embodiments of the invention. At 102, a programmable cell master is generated which supports visual editing. This action is used to implement a pcell that is capable of being visually edited and/or operated upon with advanced editing methodologies. Such pcells are referred to herein as a "smart pcell". The smart pcell is a pcell whose implementation function creates smart shapes, which as described above are shapes that can be visually edited as described herein, and whose sub-masters contain smart shapes. The smart pcell is also associated with one or more smart editing functions that are used to make changes to the pcell corresponding to any changes made by a user with the layout editor.

At 104, an instance is created for the programmable cell. In other words, the pcell master is evaluated using a given set of parameter values to create an instantiation of the design element(s) that correspond to the pcell. This forms a set of objects/geometries that exist on the layout of an electrical design. The layout editor is informed of the nature of the pcell being a "smart" pcell having one or more smart shapes. In this way, the layout editor knows that a smart editing function needs to be called to actually implement any edits or changes to the pcell that is desired by the user.

Assume at this point that it is desired to edit the electrical design, e.g., using a layout editor. A graphically based user interface may be used by the user, at 106, to manipulate the size or configuration of the pcell instance. For example, the user may desire to perform any or all of the following editing functions on the pcell instance: stretch one or more portions of shapes; perform chopping function; perform merging function; perform polygon conversion; perform keep-out generation or tunneling; perform keep-out deletion or healing; perform abutment.

The results of the graphical editing are saved, at 108, by automatically updating and propagating the parameters of the programmable cell based upon the results of the editing. According to some embodiments, a smart editing function is called to actually implement the graphical edits/changes by the layout editor to the pcell parameters. For example, assume that the user has updated a smart shape, e.g., by stretching the smart shape. The smart shapes within the pcell instance are shapes within a sub-master which directly corresponds to a pcell parameter, and which can be edited by the layout editor tool. The smart shape SKILL updating function updates a smart pcell instance parameter as a function of an editing done on a smart shape within the instance sub-master. This function is automatically called by the layout editor when editing the smart shape. The updating function is registered on the smart pcell super master. The result is an entirely new pcell sub-master with parameter values that correspond to the results of the visual editing.

Figure 2:
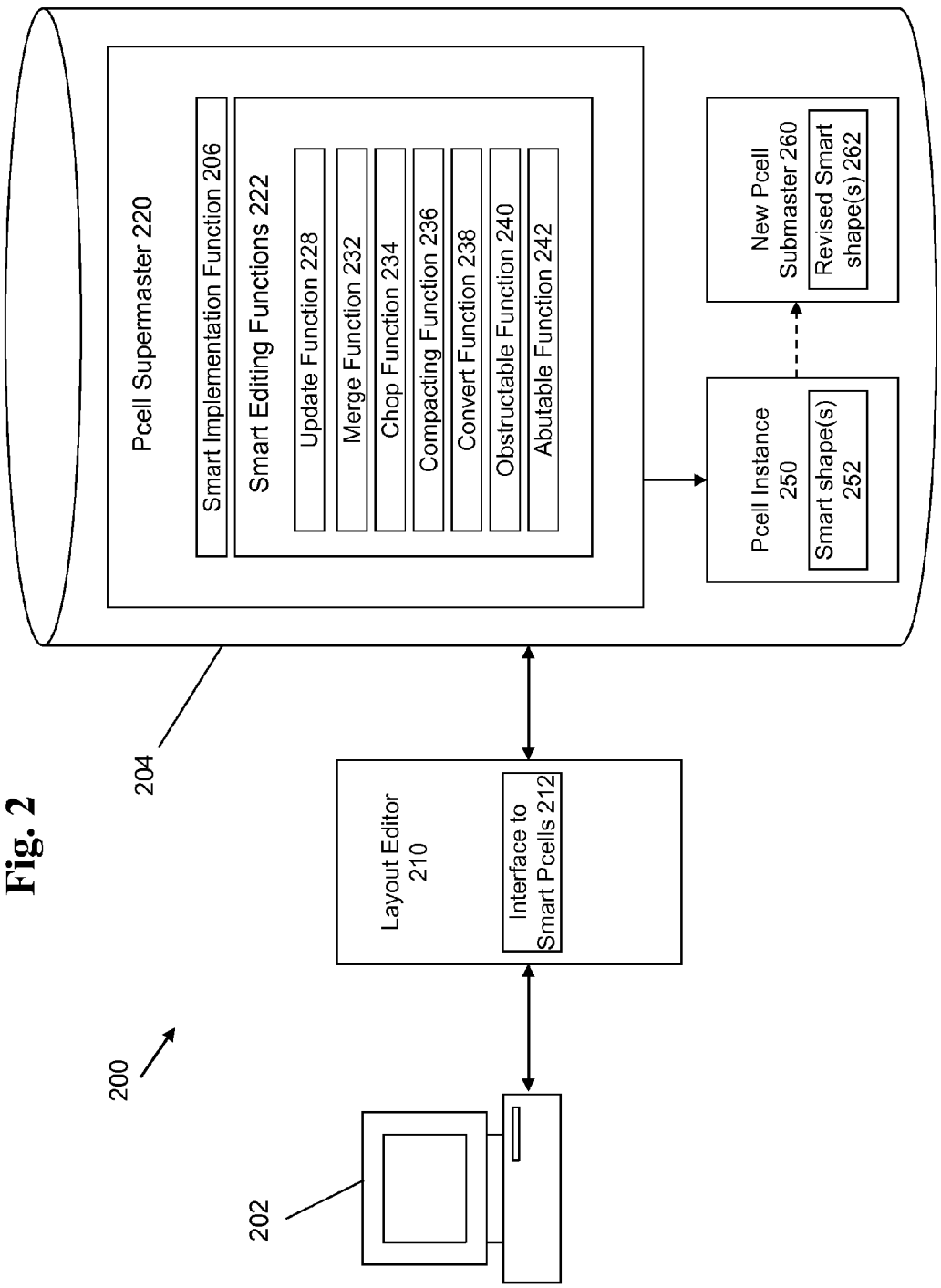
FIG. 2 illustrates an example system which may be employed in some embodiments of the invention to allow visual editing of programmable cells.

FIG. 2 illustrates an example system 200 which may be employed in some embodiments of the invention to allow visual editing of programmable cells. System 200 may include one or more users at one or more user stations 202 that operate the system 200 to design or edit electronic designs. Such users include, for example, design engineers or verification engineers. User station 202 comprises any type of computing station that may be used to operate, interface with, or implement EDA applications or devices. Examples of such user stations 202 include for example, workstations, personal computers, or remote computing terminals. User station 202 comprises a display device, such as a display monitor, for displaying electronic design layouts and processing results to users at the user station 202. User station 202 also comprises one or more input devices for the user to provide operational control over the activities of system 200, such as a mouse or keyboard to manipulate a pointing object in a graphical user interface.

The electronic designs may be stored in a computer readable storage device 204. Computer readable storage device 204 comprises any combination of hardware and software that allows for ready access to the data that is located at the computer readable storage device 204. For example, computer readable storage device 204 could be implemented as computer memory operatively managed by an operating system. The computer readable storage device 204 could also be implemented as an electronic database system having storage on persistent and/or non-persistent storage. According to the present embodiment, the electronic design and analysis results are placed into the computer readable storage device 204, including pcell super masters 220 and pcell instances 250.

A design editing tool, such as a layout editor 210, may be used by users at a user station 202 to create or edit electronic designs. Any suitable computer aided design (CAD) tool or electronic design automation (EDA) design tool can be used as a layout editor.

The smart shapes for the pcell super master 220 are created with the smart implementation function 206. The smart implementation function 206 is used to specify to the design tool 210 which are the smart shapes in a pcell. This smart implementation function 206 is accomplished, according to some embodiments, by tracking the smart shape information and allowing the design tool 210 to identify which of the shapes are smart shapes using that information, which permits the design tool to be able to discriminate between smart shapes and regular shapes. This in turn allows the user to select and edit the smart shapes using the layout editor. According to some embodiments, the smart implementation function 206 is implemented as a SKILL function that is called via an application programming interface (API) from the design tool.

After the user has edited the smart pcell, one or more smart editing functions 222 are employed to realize and propagate those changes to the pcell. Any appropriate editing functionality may be implemented by the smart editing function 222. For example, the following editing functions may be defined for and associated with the pcell super master: update function 228; merge function 232; chop function 234; compacting function 236; convert function 236; obstruction function 240; and abutting function 242. Each of these functions is described in more detail below. According to some embodiments, the smart editing functions 222 are implemented as SKILL functions which update parameters of a given pcell instance. For example, the update function 228 may be used to implement updates to the shape parameters reflect the editing performed by the user upon a smart shape within the pcell instance. As described in more detail below, the merge function 232, chop function 234, compacting function 236, convert function 236, obstruction function 240, and abutting function 242 may be used to perform edits to selected smart pcell instances. These smart editing functions may themselves call the update function 228 with regard to any instance edits that involve changes to smart shapes within the pcell instances.

An interface 212 is employed to allow the layout editor 210 to properly interact with the smart implementation function 206 and/or smart editing functions 222. The interface 212 may be implemented with hooks to the smart editing functions 222 and/or creation functions that may be employed to generate pcell instances or masters. According to some embodiments, standardized function prototypes and/or APIs are utilized to allow the layout editor to properly interact with the smart editing function 222 or smart implementation function 206.

Assume that a pcell instance 250 is created based upon the pcell super master 220. The pcell instance 250 includes a smart shape 252 created by the implementation function 206 that is editable using one of the smart editing functions 222.

System 200 embodying the present invention allows a user at user station 202 to use the layout editor 210 to visually edit the smart pcell instance 250 and/or the smart shape 252 using some form of graphical user interface, as opposed or in addition to allowing the pcell instance to be programmatically edited. This allows the user to graphically manipulate either the smart pcell 250 or its smart shape 252 in a visual manner with immediate visual feedback of the editing results.

The visual edits that are made to the smart pcell or smart shapes are correspondingly made to the appropriate parameters within the pcell instance 250. The layout editor 210 implements the edits by calling the appropriate smart editing function 222 for the specific type of edit being performed. According to some embodiments, the smart editing function 222 that is called is a SKILL function which updates the shape parameters of the pcell instance 250, which then causes a new pcell sub-master 260 to be created having the new shape parameters. The new shape parameters are reflected in a revised smart shape 262 within the new pcell sub-master 262.

Figure 3A:
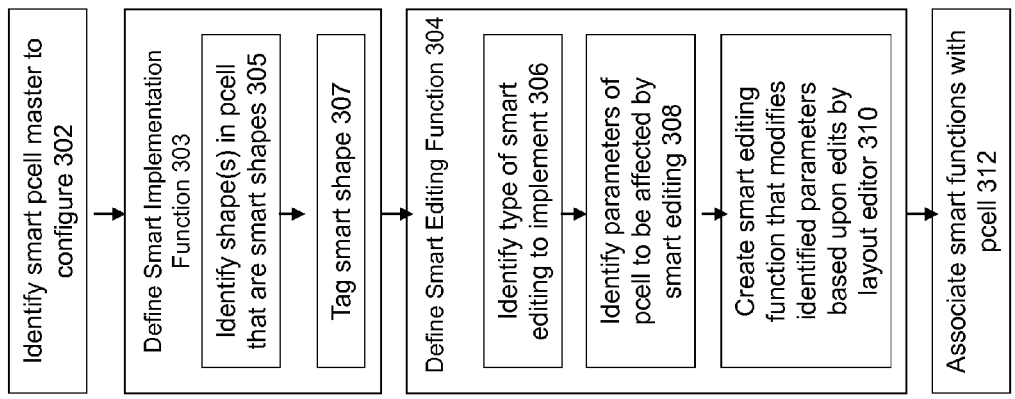
FIG. 3A shows a flowchart of a process for creating a smart pcell according to some embodiments of the invention.

FIG. 3A shows a flowchart of a process for creating a smart pcell according to some embodiments of the invention. At 302, the process identifies the pcell master that is to be configured. The pcell smart implementation function is defined at 303. The smart implementation function 303 provides the functionality to specify the smart shapes in a pcell, by tracking the smart shape information and using that information to allow the layout editor 210 to identify which of the shapes are smart shapes. Therefore, at 305, the process identifies the shapes in the pcell that are to be defined as the smart shapes. The smart shapes are the parameterized shapes in the design that can be visually edited by the user using the layout editor.

At 307, the smart shapes are "tagged" or named to identify the smart shapes in the pcell, which allows the system to distinguish the smart shapes from non-smart shapes. The tag associated with the smart shape is used to identify specific smart shapes in a pcell instance. In the case of a pcell sub-master containing several smart shapes, the tags allow identification of the specific parameters that correspond to the smart shape being edited.

It is noted that the tag can be used for other purposes with respect to the pcell, in addition to its function with regard to naming for the pcell. For example, the tag can be used for adding a property or adding an extension.

At 304, the smart pcell editing function(s) are defined and configured. The type of smart editing that will be implemented for the pcell is identified at 306. According to some embodiments of the invention, different types of smart editing may be associated with different and/or separate smart editing functions and functionality. Therefore, it is important to identify upfront the types of smart editing that is desired, so that corresponding smart editing functions can be created for those types of desired editing.

At 308, identification is made of the parameters that may be affected by the anticipated smart editing functionality. The smart editing/updating function is then created for the pcell at 310. The smart editing/update function is used to update the appropriate pcell parameters based upon smart editing results created by the user. These parameters are unknown to the layout editor, but are manipulated based upon actions performed at the layout editor which affects these parameters.

Thereafter, at 312, the new functions are associated with the pcell, e.g., by registering the functions with the pcell super master.

Figure 3C:
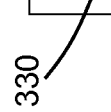
FIG. 3C shows an example function for updating pcells according to some embodiments of the invention.

FIG. 3B shows an example function for defining pcells. The example function defines the list 320 of shapes for the pcell, the type 322 of shapes, and the parameters for those shapes. FIG. 3C shows an example function for updating pcells. This example function identifies the parameters that may be updated by the update functionality, and sets values for those parameters based upon actions taken by the layout editor. For example, the orientation 330 of the shape may be updated by the update functionality.

Figure 4:
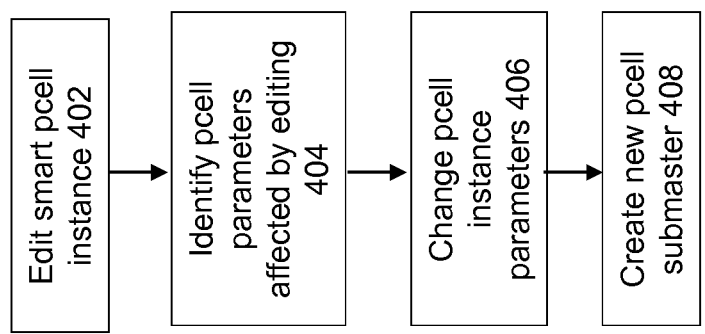
FIG. 4 shows a flow of a process for editing a smart pcell according to some embodiments of the invention.

FIG. 4 shows a flow of a process for editing a smart pcell according to some embodiments of the invention. The process assumes that an instance of the pcell has already been created with a smart shape and is available for editing. At 402, the user edits the smart shape within the pcell instance. Any suitable approach or layout editing tool can be used to edit the layout. For example, the user may employ a conventional layout editor having a graphical interface for manipulating the smart shape.

The manipulations by the user will change the size, orientation, configuration or dimensions of the pcell smart and/or of the smart shapes within the pcell. The layout tool will interface with the smart editing function update and propagate the changes made by the user. The updating function will, at 404, identify the pcell parameters that are affected by the user edits. Next, at 406, the updating function changes the instance parameters to conform to the editing results created by the user. Thereafter, a new pcell sub-master is created at 408 which correspond to the user edits.

Figure 5:
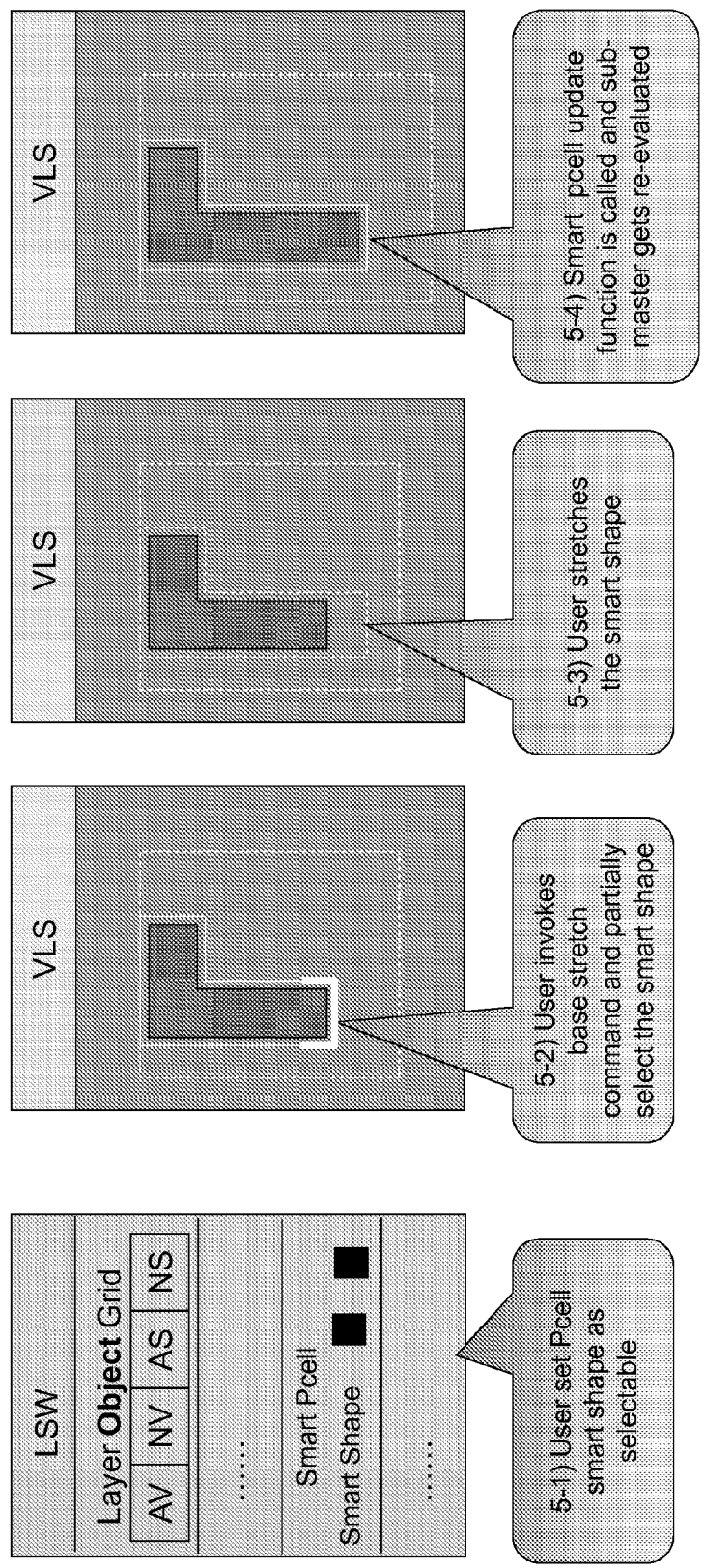
FIG. 5 illustrates an example approach for implementing the update function for a smart pcell based upon edits to a smart shape, according to some embodiments of the invention.

FIG. 5 illustrates an example approach for implementing the update function for a smart pcell based upon edits to a smart shape, e.g., edits to stretch part or all of the pcell smart shape. This functionality allows the user to visually manipulate the dimensions of an object in the layout. The left-most portion (5-1) of the figure shows an example user interface for initiating the action to stretch a smart shape within a pcell. In this example, the user sets the smart pcell shape to be "selectable" so that it can be "grabbed" by the user with an interface control (such as a mouse control over a mouse pointer) to select a portion or all of the shape.

The next portion (5-2) of the figure shows the user invoking the stretch command to partially select the smart shape, at the darkened portion of the shape. Next portion (5-3) shows the user stretching the smart shape in a downward direction. Finally, at (5-4), the layout tool calls the pcell update function such that the pcell shape parameters are updated and re-evaluated to create a new pcell sub-master that corresponds to the dimensions and configurations shown in (5-4).

Figure 6:
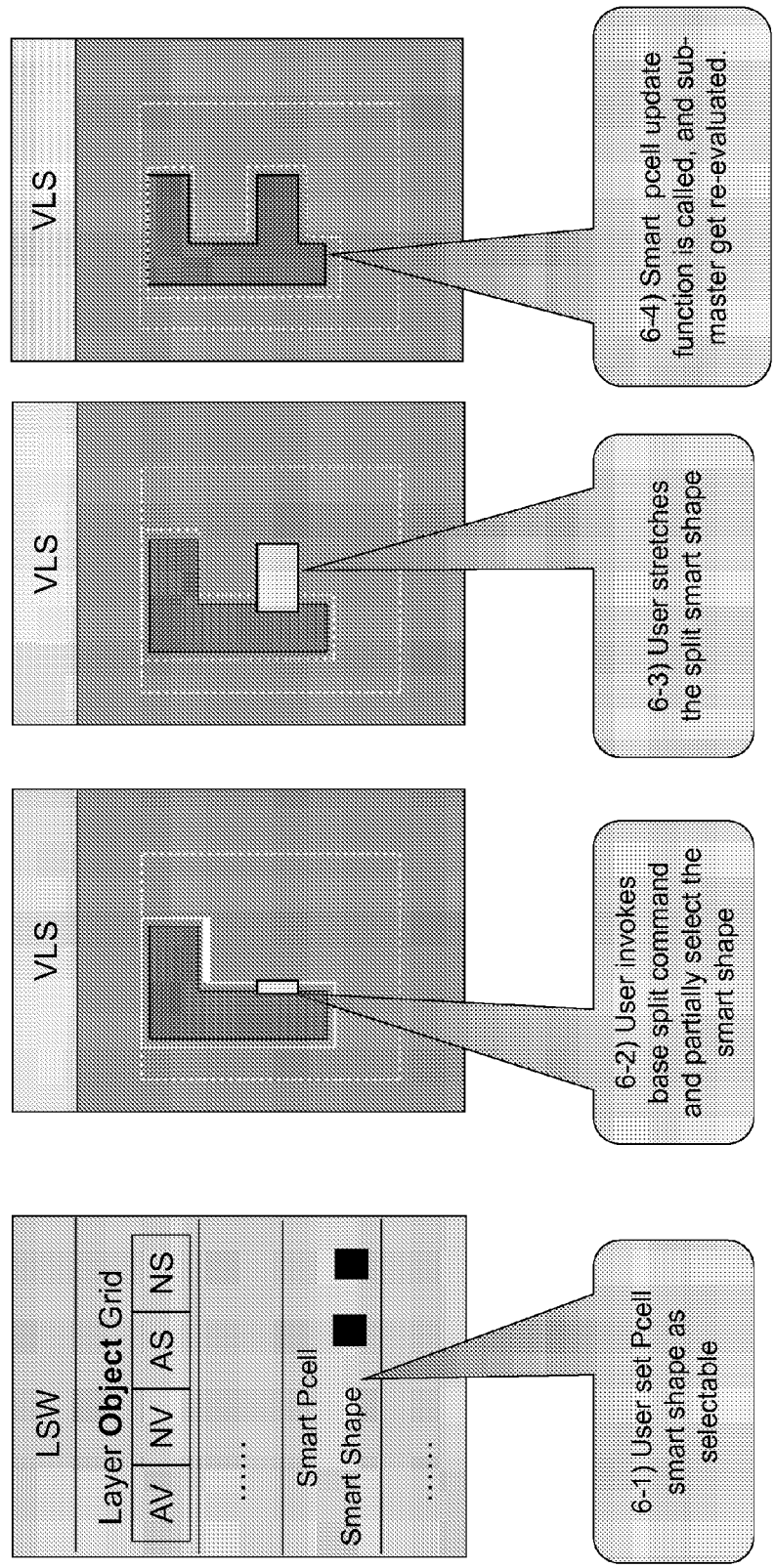
FIG. 6 illustrates an example approach for implementing the splitting function for a smart pcell, according to some embodiments of the invention.

FIG. 6 illustrates an example approach for implementing the splitting function for a smart pcell, which can also be implemented by calling a smart editing function in the form of the update function. This functionality allows the user to split an edge of a shape in the layout. The left-most portion (6-1) of the figure shows an example user interface for initiating the action to split a smart shape within a pcell. In this example, the user sets the smart pcell shape to be "selectable" so that it can be selected by the user with an interface control for a portion or all of the shape.

The next portion (6-2) of the figure shows the user invoking the split command to partially select a portion of an edge for the smart shape, at the darkened portion of the shape. Next, portion (6-3) shows the user extending the selected portion of the smart shape. At (6-4), the layout tool calls the pcell update function such that the pcell shape parameters are updated and re-evaluated to create a new pcell sub-master that corresponds to the dimensions and configurations shown in (6-4), where the selected portion has been extended as shown in the figure.

Figure 7:
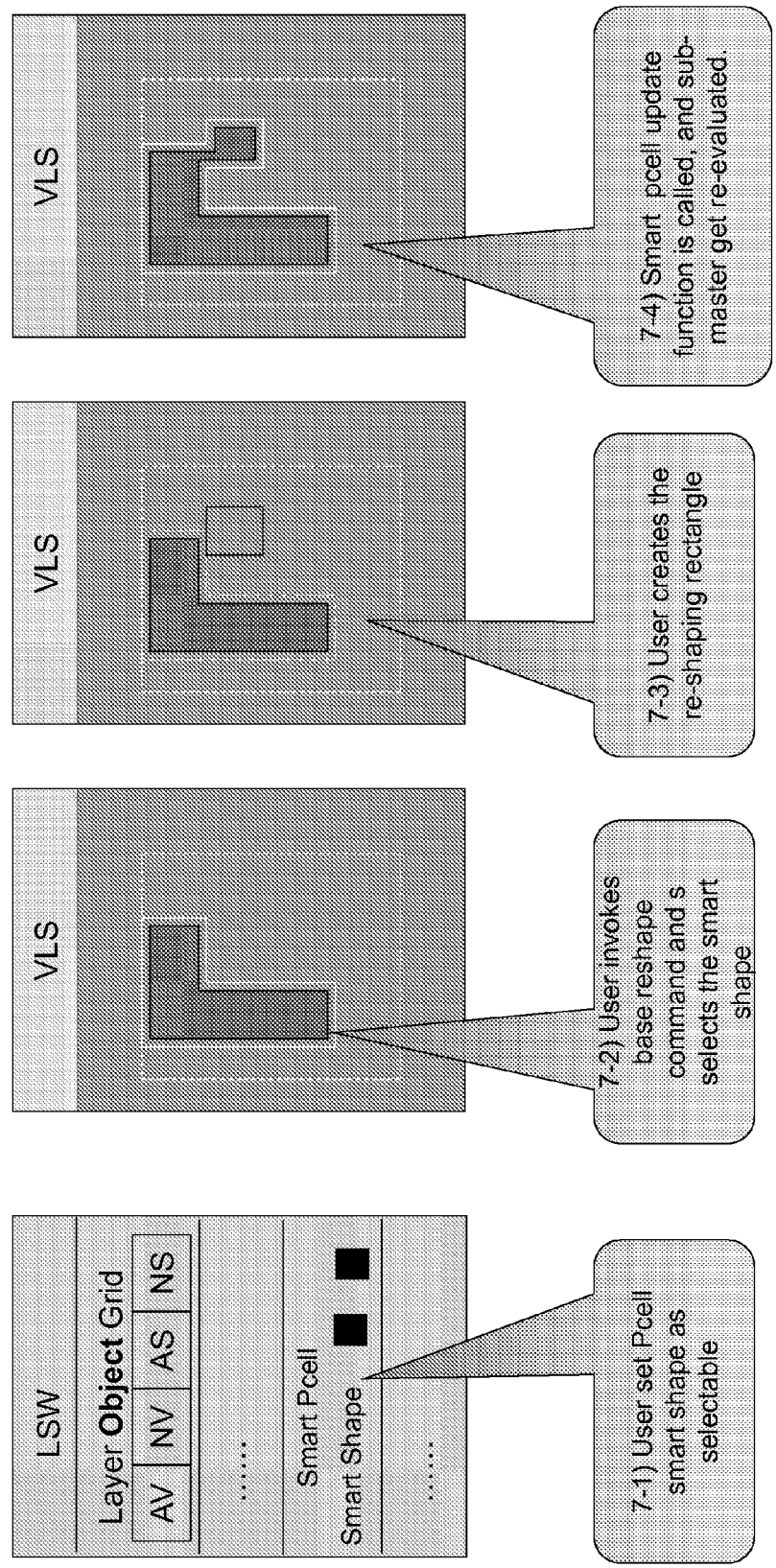
FIG. 7 illustrates an example approach for implementing the re-shaping function for a smart pcell according to some embodiments of the invention.

FIG. 7 illustrates an example approach for implementing the re-shaping function for a smart pcell. This functionality allows the user to re-configure the shape of an object in the layout. The leftmost portion (7-1) of the figure shows an example user interface for initiating the action to split a smart shape within a pcell. In this example, the user sets the smart pcell shape to be "selectable" so that it can be selected by the user with an interface control for a portion or all of the shape.

The next portion (7-2) of the figure shows the user invoking the re-shape command to select the smart shape for editing. Next, portion (7-3) shows the user creating a re-shaping rectangle that will be used for extending or changing the configuration or dimensions of the original shape. At (7-4), the layout tool calls the pcell update function such that the pcell shape parameters are updated and re-evaluated to create a new pcell sub-master that corresponds to the dimensions and configurations shown in (7-4), where the selected portion has been extended as shown in the figure.

Figure 8:
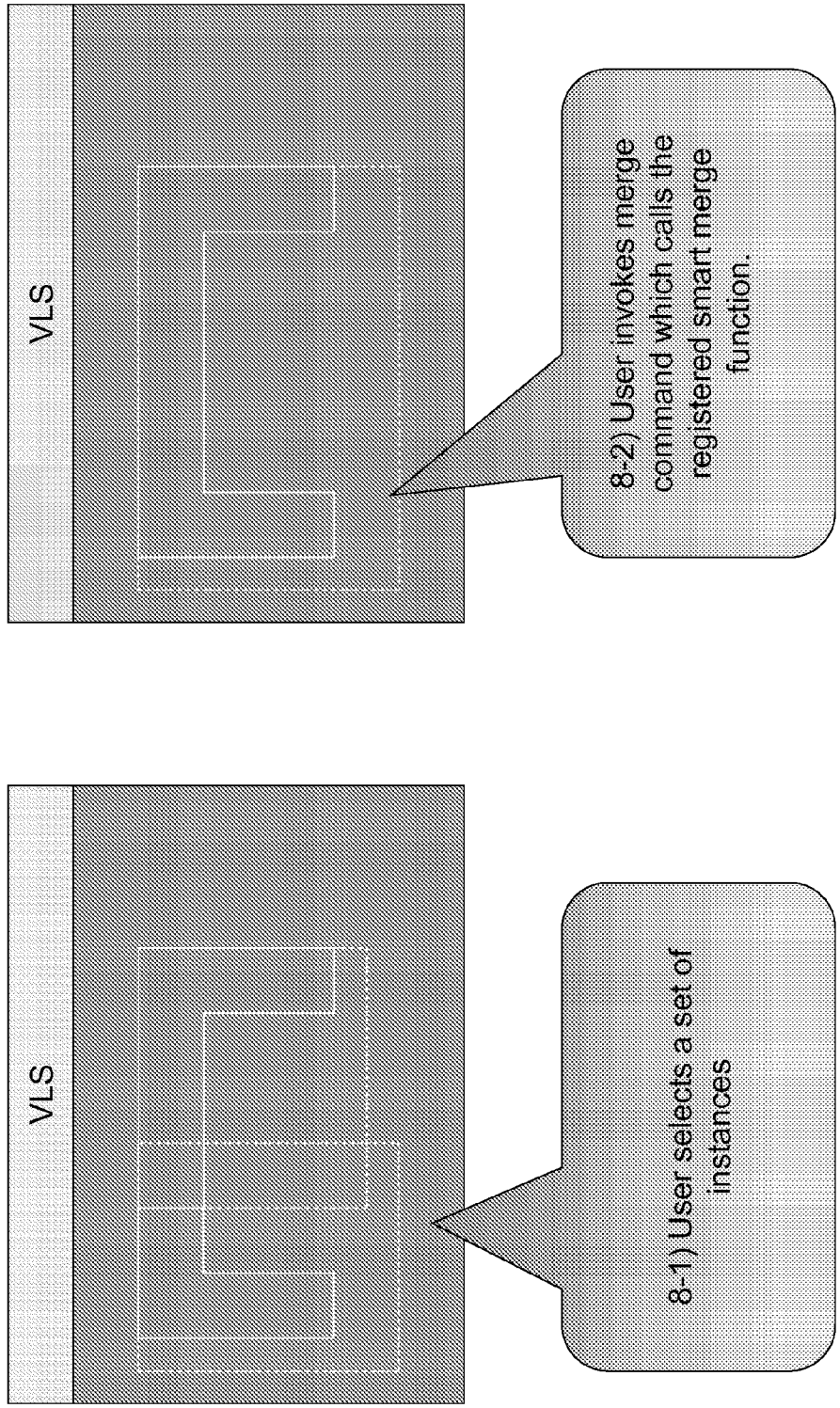
FIG. 8 illustrates an example approach for implementing the merging function for a smart pcell according to some embodiments of the invention.

FIG. 8 illustrates an example approach for implementing the merging function for a smart pcell, which merges two or more pcell instances together into a single new pcell sub-master. Unlike the update function which directly operates upon smart shapes, the merge function operates upon pcell instances. Therefore, the leftmost portion (8-1) of the figure shows an example user interface in which the user has selected two instances to merge together. According to one embodiment of the invention, the two instances are instances of the same pcell master. In alternative embodiments, the two instances may be from different pcell masters. While the example only shows two instances being selected, it is noted that an implementation of the invention may provide for any number of instances to be selected for merging.

At (8-2), the user invokes the merge command within the layout tool (which in certain tools may be in a menu structure at "Edit->instance->merge"), which causes the layout tool to call the appropriate pcell update function such that the pcell instance parameters are updated and re-evaluated to create a new pcell sub-master that corresponds to the dimensions and configurations of the merged and combined instances from (8-1). The configuration of the new pcell sub-master is shown in (8-2). This function is implemented by copying the pcell smart shapes to a top level, and merging the smart shapes. Therefore, it is possible that the smart update function is utilized to implement the merge function. For all the merged shapes, the function creates an instance of the super master based upon the merged shape, e.g., by performing a Boolean AND operation upon the shapes to merge. For the sake of clarity, the figure only displays the smart shape and does not display maskable geometries.

Figure 9A:
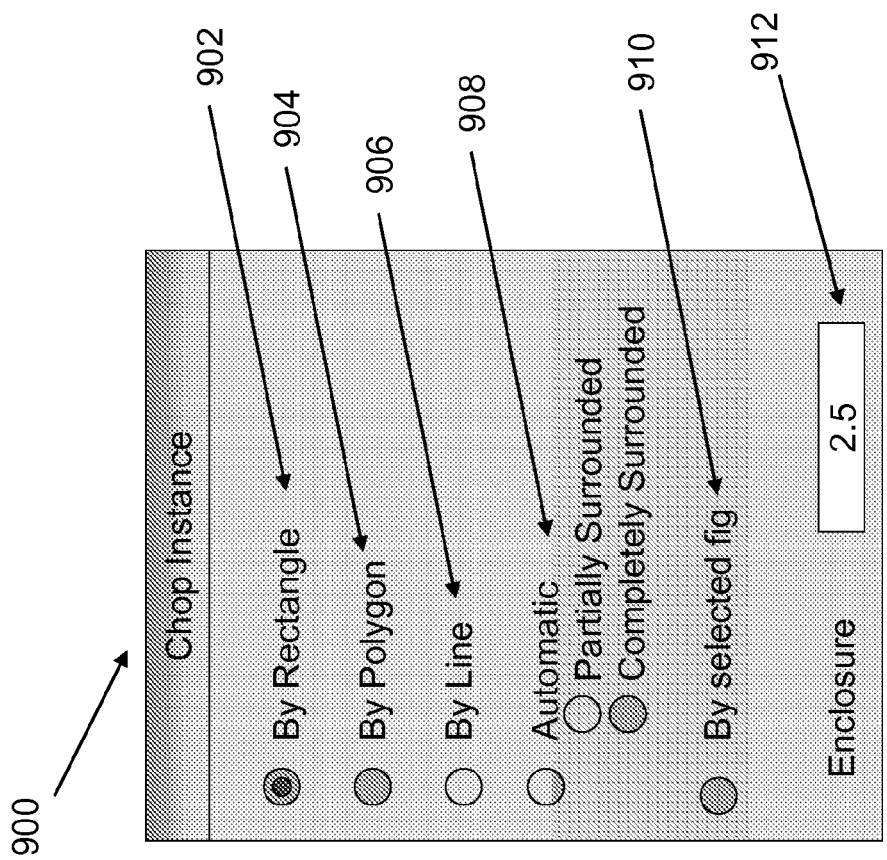
FIGS. 9A-C illustrate an example approach for implementing the chopping function for a smart pcell according to some embodiments of the invention.
Figure 9B:
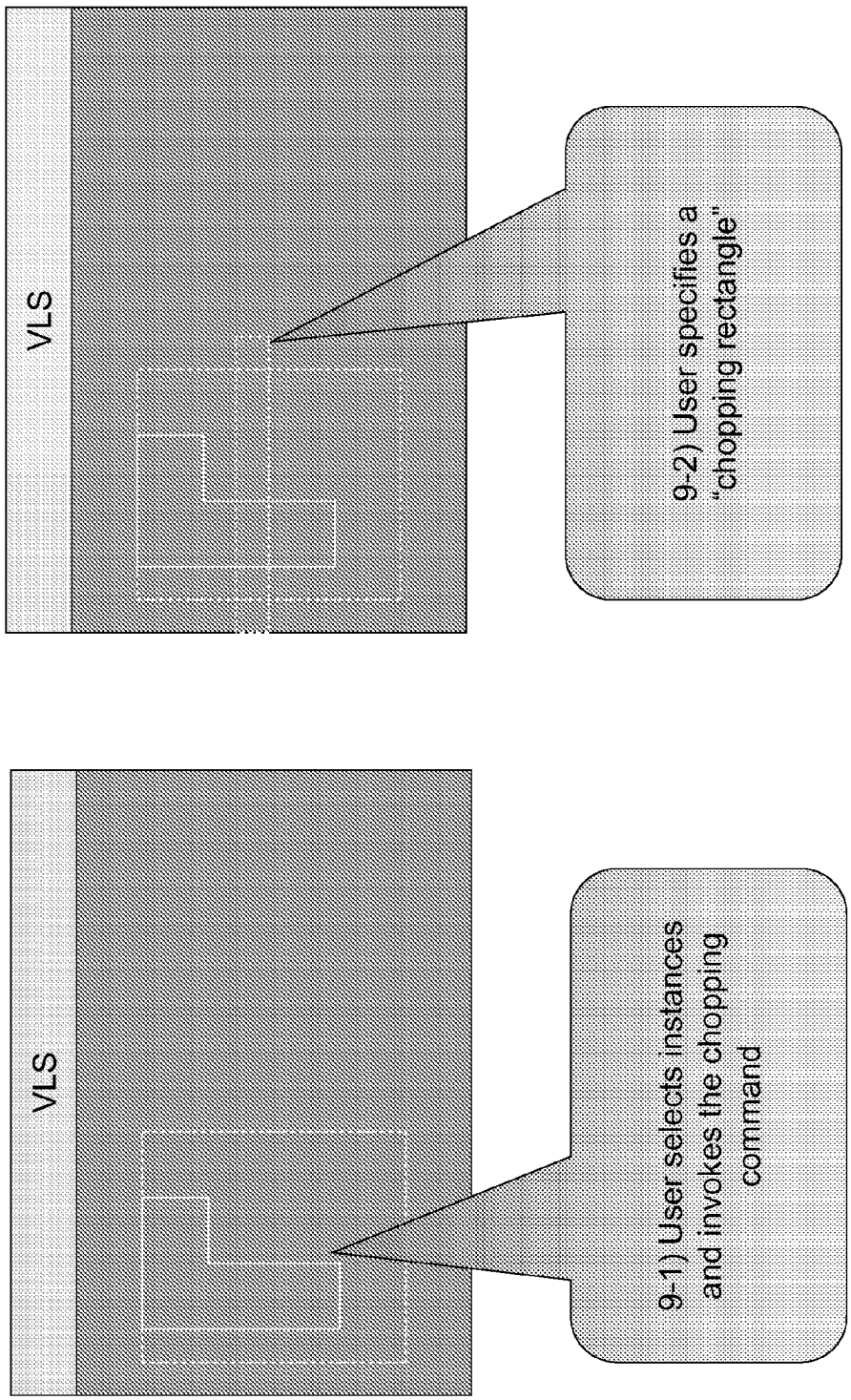
Figure 9C:
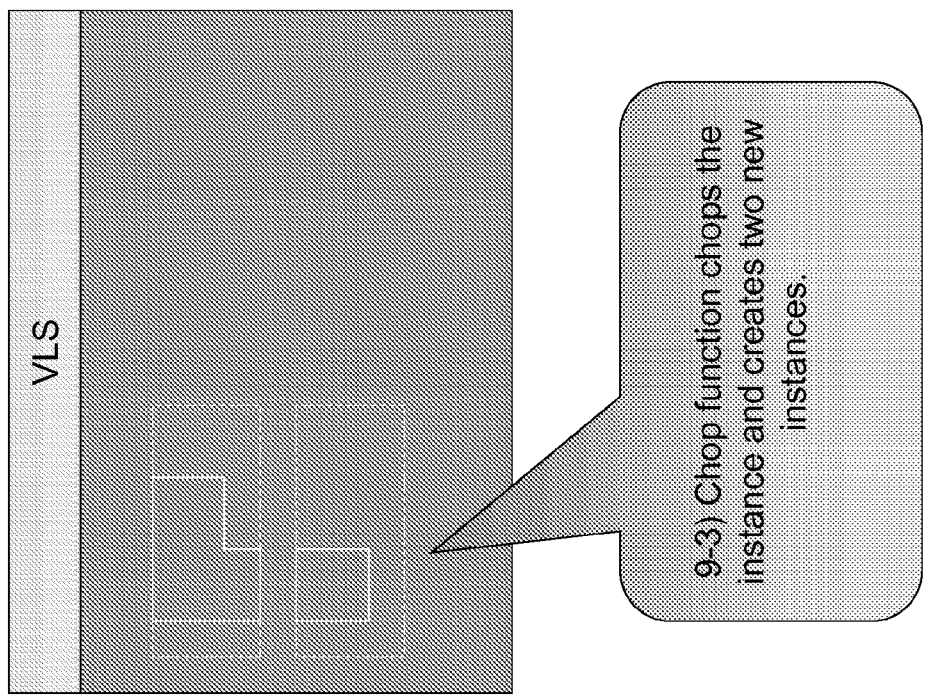

FIGS. 9A-C illustrate an example approach for implementing the chopping function 900 for a smart pcell (which in certain tools may be in a menu structure at "Edit->instance->chop"). FIG. 9A illustrates an example interface for invoking the chopping functionality within a layout tool. Chopping may be performed using different chopping objects. For example, the user may specify that the chopping is to be performed using a chopping rectangle 902, chopping polygon 904, or a chopping line 906. In addition, the chopping interface may specify automatic chopping 908 that automatically considers all partially or completely surrounded figures as chopping figures. In the addition, the interface may be invited to use selected figures 910 as the chopping figures. The enclosure parameter 912 may be employed, e.g., in a manner where it is only used in automatic 908 or selected FIG. 910 modes.

The leftmost portion (9-1) of FIG. 9B shows an example user interface in which the user has selected an instance to chop. While the example only shows one instance being selected for chopping, it is noted that an implementation of the invention may provide for any number of instances to be selected for chopping.

At (9-2), the user specifies a chopping rectangle, which essentially forms as a keep-out bounding box that overlays upon the shapes in the selected instance(s). As shown in (9-3) in FIG. 9C, the chopping rectangle chops the selected instance to create two new instances. The new instances are created by updating pcell instance parameters for the pcell and re-evaluating those parameters to create the new pcell sub-masters that correspond to the dimensions and configurations of the two new instances that have been chopped from the previously selected single instance. For the sake of clarity, the figure only displays the smart shape and does not display maskable geometries.

Figure 10:
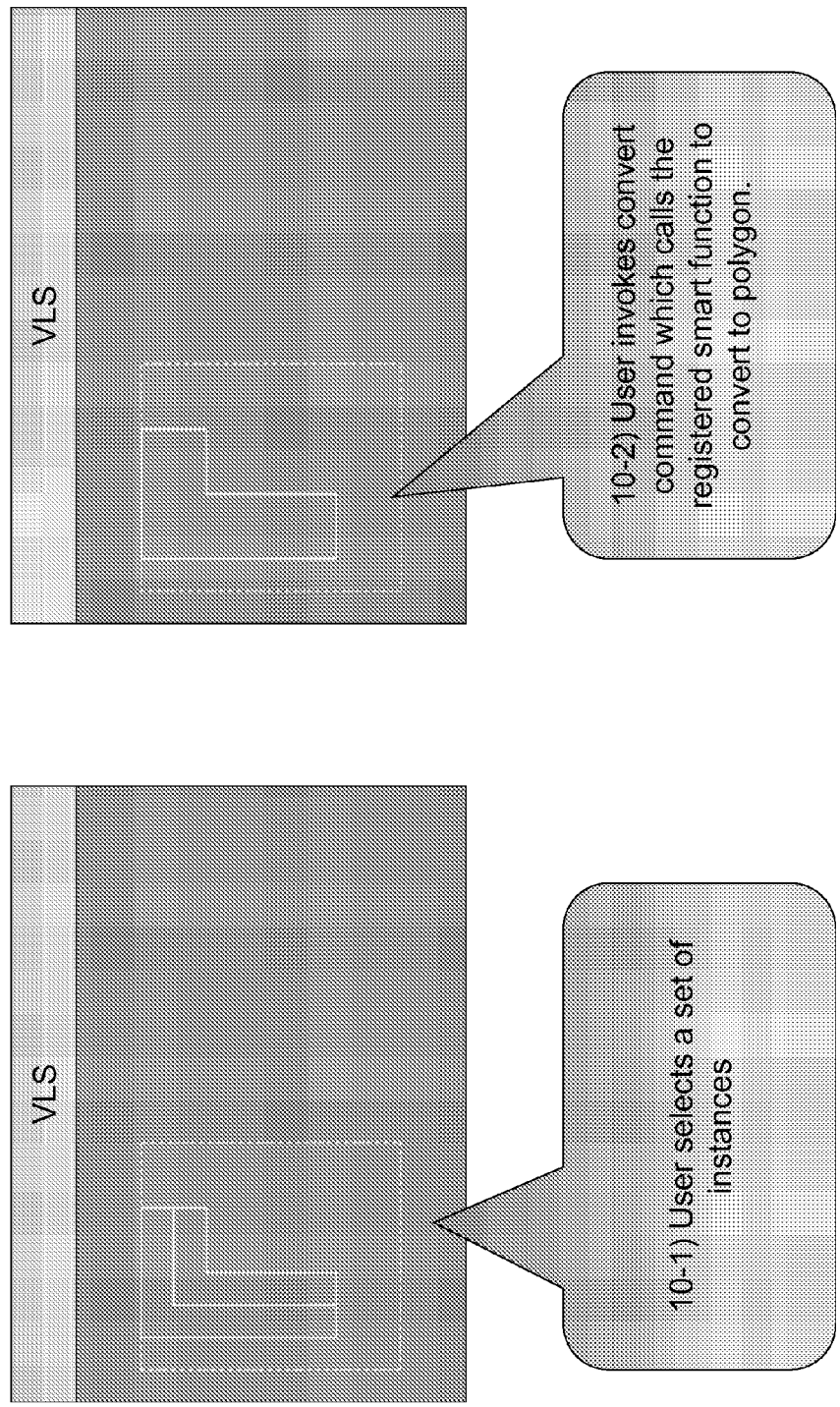
FIG. 10 illustrates an example approach for implementing the convert-to-polygon function for a smart pcell according to some embodiments of the invention.

FIG. 10 illustrates an example approach for implementing the convert-to-polygon function for a smart pcell. This function converts a smart pcell instance into a polygon.

As shown in FIG. 10 at (10-1), the user has selected a set of one or more instances to convert. In this example a path has been selected for conversion. As shown in (10-2), the user invokes the convert-to-polygon functionality of the layout tool (which in certain tools may be in a menu structure at "Edit->instance->convert"), which in turn called the convert-to-polygon function updating function associated with and registered to the pcell. This updating function updates the instance parameters for the pcell and re-evaluating those parameters to create the new pcell sub-master that correspond to the dimensions and configurations of the new polygon that corresponds to the original path, as shown in (10-2).

Figure 11A:
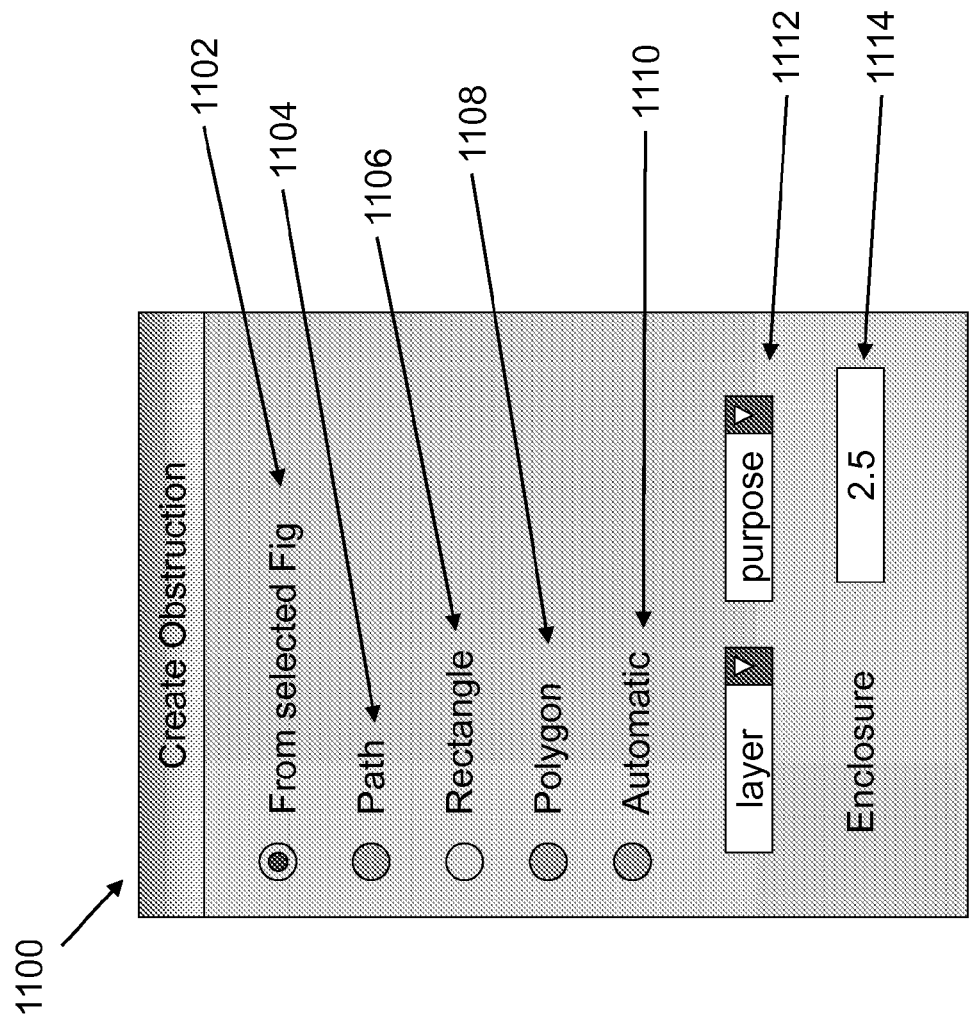
FIGS. 11A-B illustrate an example approach for implementing an obstructable pcell according to some embodiments of the invention.
Figure 11B:
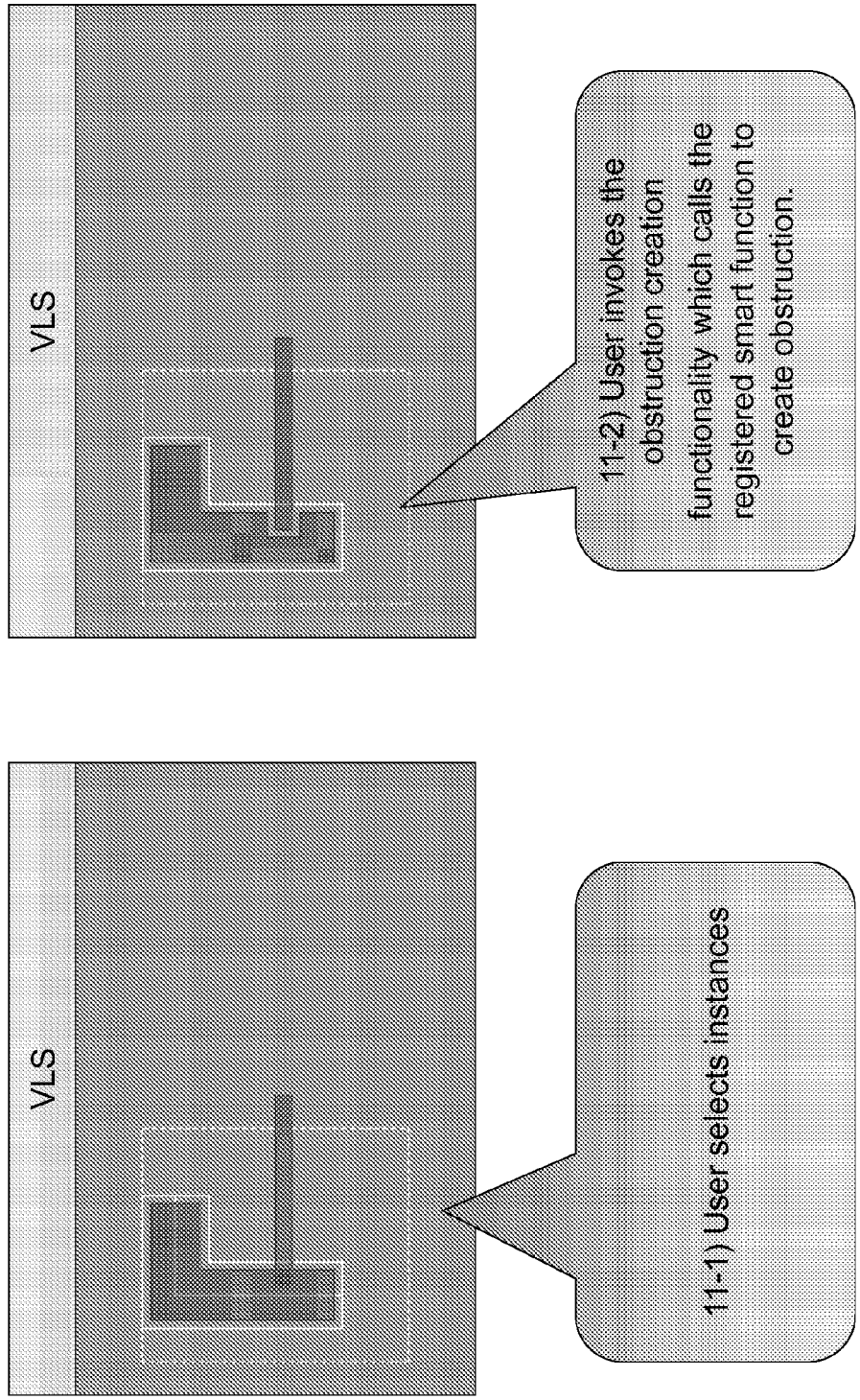

FIGS. 11A-B illustrate an example approach for implementing an obstructable pcell according to some embodiments of the invention. This functionality operates upon the obstruction parameter for the pcell, which is a pcell parameter that specifies the layer-based obstructions above a pcell instance. For example, the following may be specified as the obstruction parameters:

((("metal1") ((0 0) (2 2)) ((4 5) (7 8))) (("metal2") ((3 0) (2 6)) ((4 5) (7 8))))

The obstruction deletion function operates by deleting all obstruction parameters on a user specified layer list. The following is an example function prototype deleteObstruction(d_inst 1_layerPurposePair@optional 1_points)

For this type of function, if 1_points is not defined, then delete all obstructions on 1_layerPurposePair. If length (1_points)==1, then delete all obstructions which would contain that point (emulation of point select). If length(1_points)==2, then delete all obstructions fully contained by the rectangle defined by 1_points.

FIG. 11A illustrates an example interface 1100 (which in certain tools may be in a menu structure at "Edit->instance->create obstruction") for invoking the obstruction functionality within a layout tool. Obstructing a pcell instance may be performed using different obstruction mechanisms. For example, the user may specify that the obstruction is to be configured using a FIG. 1102 that overlaps the guard ring to obstruct, path 1104 over the selected guard ring, rectangle 1106 over the selected guard ring, or polygon 1108 over the selected guard ring. The interface 1100 may include a command 1110 to automatically specify the shapes that overlap the selected guard ring giving birth to the obstruction. Filters 1112 may be specified, e.g., based on the "layer" or "purpose" filters. The enclosure parameter 1114 may also be employed in this interface 1100, e.g., in a manner where it is only used in conjunction with the automatic mode 1110.

FIG. 11B illustrates the obstruction process. At (11-1), the user selects a set of instances to process. As shown in (11-2), the user invokes the obstruction creation functionality of the layout tool (which in certain tools may be in a menu structure at "Edit->instance->create obstruction"), which in turn called the appropriate smart updating function associated with and registered to the pcell. This updating function updates the instance parameters for the pcell and re-evaluates those parameters to create the new pcell sub-master that takes the obstruction into account, and now includes shapes having the dimensions and configurations as shown in (11-2).

Figure 12:
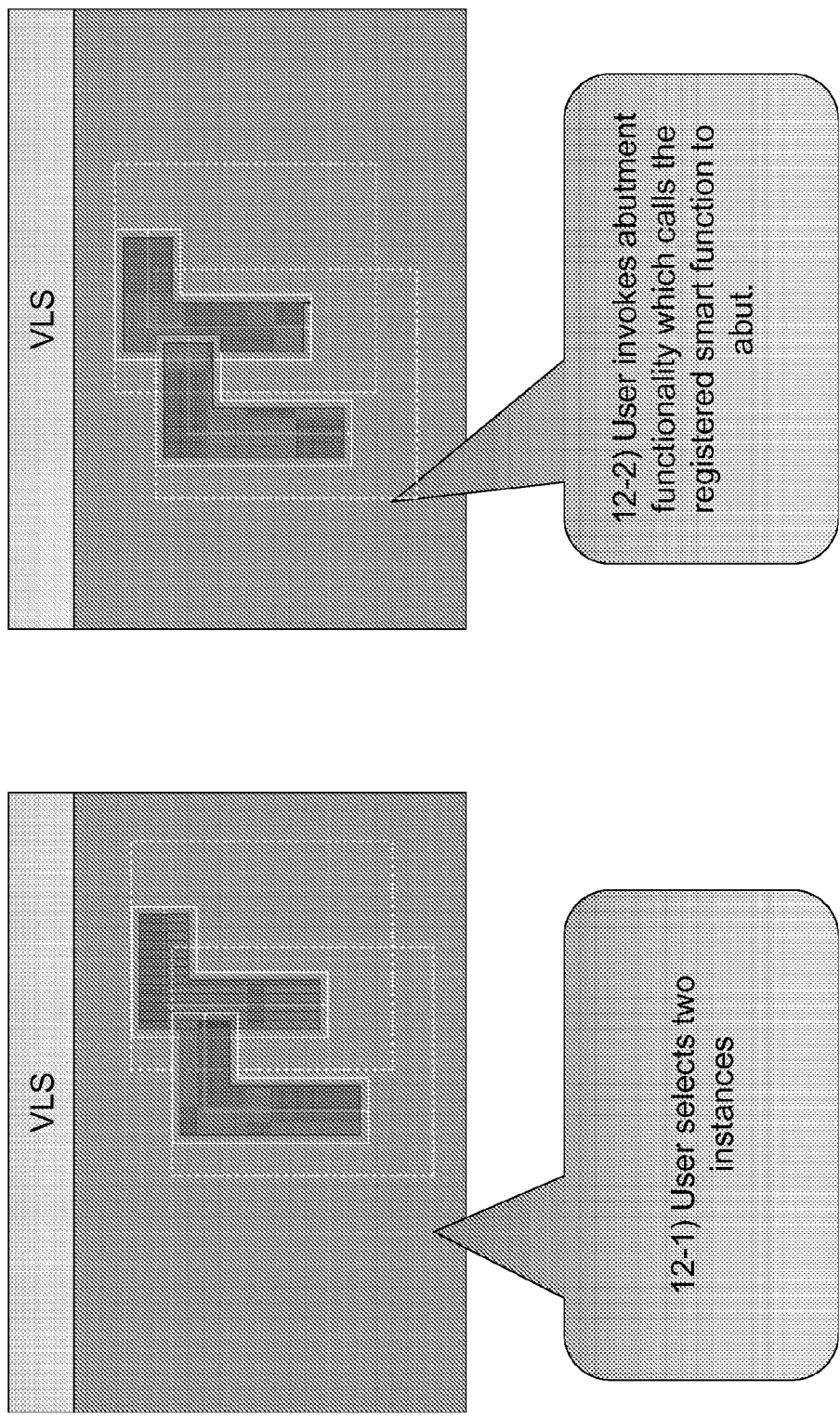
FIG. 12 illustrates the abutment process according to some embodiments of the invention.

FIG. 12 illustrates an example approach for implementing an abutable pcell according to some embodiments of the invention. This function creates abutting pcell instances within a layout, and takes into account a determination of the edges to abut as well as the correct overlap margin. These can be specified by the user. In one approach, existing obstructions are deleted and re-created. For a guard ring, the general idea is to create obstructions from the master guard ring inst sub-master shapes to the slave guard ring instance. The abut function should generate obstructions on slave guard ring based on contacts and vias in master guard ring.

FIG. 12 illustrates the abutment process. At (12-1), the user selects a set of instances to process, which are overlapping instances. As shown in (12-2), the user invokes the abutment functionality of the layout tool (which in certain tools may be in a menu structure at "Edit->instance->abut"), which in turn calls the appropriate smart editing function associated with and registered to the pcell. This updating function updates the instance parameters for the pcell and re-evaluating those parameters to create the new pcell sub-master(s) that takes the abutment into account along with the overlap margin. The final result includes shapes having the dimensions and configurations as shown in (12-2).

System Architecture Overview

Figure 13:
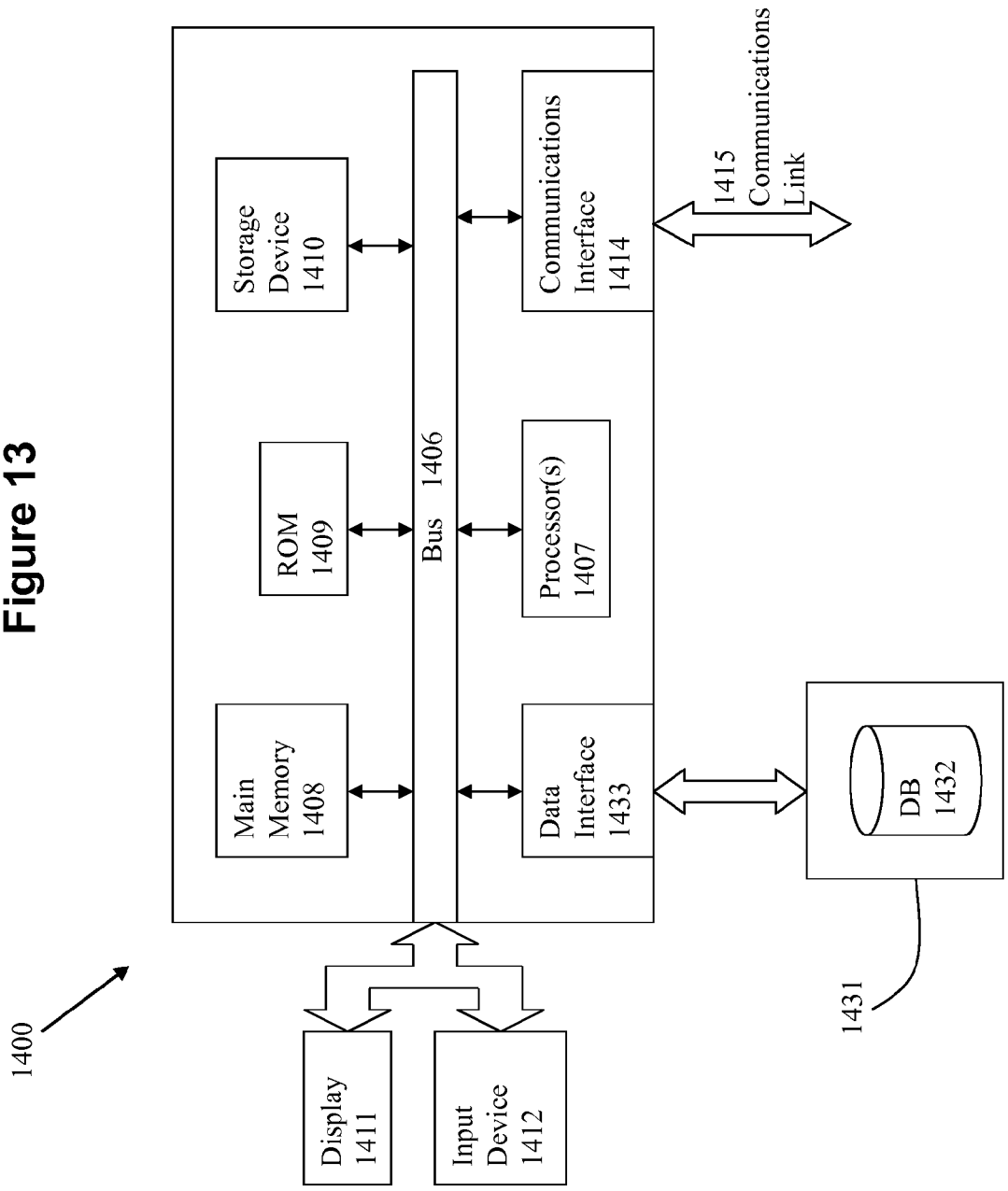
FIG. 13 is a block diagram of an illustrative computing system suitable for implementing an embodiment of the present invention.

FIG. 13 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer-implemented method that is executed with a processor for graphically editing a parameterized cell for an electronic design, comprising:
   using at least the processor to perform a process, the process comprising:
   identifying an instance of a parameterized cell to be graphically edited;
   editing the instance of the parameterized cell using a visual graphical editor interface;
   identifying one or more parameters affected by the editing of the instance of the parameterized cell;
   changing the one or more parameters affected by the editing of the instance of the parameterized cell; and
   creating a new parameterized cell submaster to reflect changes to the one or more parameters affected by the editing of the instance of the parameterized cell.

2. The computer-implemented method of claim 1, wherein the editing of the instance of the parameterized cell changes size, orientation, configuration, or dimensions of shapes in the instance of the parameterized cell.

3. The computer-implemented method of claim 1, in which the editing comprises stretching one or more portions of shapes, updating, compacting, chopping, merging, polygon conversion, keep-out generation or tunneling, keep-out deletion or healing, or abutment functionality.

4. The computer-implemented method of claim 1, in which the act of identifying the one or more parameters affected by the editing of the instance of the parameterized cell comprises identifying a list of shapes and parameters for the shapes affected by the editing, and calling an editing function to implement the editing of the shapes.

5. The computer-implemented method of claim 1, in which the editing function identifies a type of editing being implemented, identifies one or more parameters affected by the editing, and performs functionality to changes the one or more parameters upon graphical edits by the editor.

6. The computer-implemented method of claim 1, in which the new parameter cell submaster comprises a smart shape or a fluid shape that is characterized by being capable of being visually edited.

7. The computer-implemented method of claim 1, the act of creating the new parameterized cell submaster comprising:
   specifying existence and an identity of an implementation function for the new parameterized cell submaster; and
   providing information about the new parameterized cell submaster to an electronic design tool such that the electronic design tool is to be used to edit the new parameterized cell submaster.

8. The computer-implemented method of claim 1, the process further comprising:
   tagging a shape in the new parameterized cell submaster with a tag; and
   identifying one or more parameters of the new parameterized cell submaster based at least in part upon the tag.

9. A computer program product embodied on a non-transitory computer usable medium, the non-transitory computer readable medium having stored thereon a sequence of instructions which, when executed by a processor causes the processor to execute a method for graphically editing a parameterized cell for an electronic design, the method comprising:
   identifying an instance of a parameterized cell to be graphically edited;
   editing the instance of the parameterized cell using a visual graphical editor interface;
   identifying one or more parameters affected by the editing of the instance of the parameterized cell;
   changing the one or more parameters affected by the editing of the instance of the parameterized cell; and
   creating a new parameterized cell submaster to reflect changes to the one or more parameters affected by the editing of the instance of the parameterized cell.

10. The computer program product of claim 9, wherein the editing of the instance of the parameterized cell changes size, orientation, configuration, or dimensions of shapes in the instance of the parameterized cell.

11. The computer program product of claim 9, in which the editing comprises stretching one or more portions of shapes, updating, compacting, chopping, merging, polygon conversion, keep-out generation or tunneling, keep-out deletion or healing, or abutment functionality.

12. The computer program product of claim 9, in which the act of identifying the one or more parameters affected by the editing of the instance of the parameterized cell comprises identifying a list of shapes and parameters for the shapes affected by the editing, and calling an editing function to implement the editing of the shapes.

13. The computer program product of claim 9, in which the new parameter cell submaster comprises a smart shape or a fluid shape that is characterized by being capable of being visually edited.

14. The computer program product of claim 9, the act of creating the new parameterized cell submaster comprising:
   specifying existence and an identity of an implementation function for the new parameterized cell submaster; and
   providing information about the new parameterized cell submaster to an electronic design tool such that the electronic design tool is to be used to edit the new parameterized cell submaster.

15. The computer program product of claim 9, the process further comprising:
- tagging a shape in the new parameterized cell submaster with a tag; and
- identifying one or more parameters of the new parameterized cell submaster based at least in part upon the tag.

16. A computer-based system for graphically editing a parameterized cell for an electronic design, comprising:
- a computer processor to execute a set of program code instructions;
- a memory to hold the program code instructions, in which the program code instructions comprises program code which, when executed by the computer processor, causes the computer processor to:
  - identify an instance of a parameterized cell to be graphically edited;
  - edit the instance of the parameterized cell using a visual graphical editor interface;
  - identify one or more parameters affected by the editing of the instance of the parameterized cell;
  - change the one or more parameters affected by the editing of the instance of the parameterized cell; and
  - create a new parameterized cell submaster to reflect changes to the one or more parameters affected by the editing of the instance of the parameterized cell.

17. The system of claim 16, wherein the computer processor is to edit the instance of the parameterized cell to change a size, orientation, configuration, or dimensions of shapes in the instance of the parameterized cell.

18. The system of claim 16, in which the computer processor that is to edit the instance is further to stretch one or more portions of shapes, update, compact, chop, merge, perform polygon conversion, perform keep-out generation or tunneling, perform keep-out deletion or healing, or perform abutment functionality.

19. The system of claim 16, in which the computer processor that is to identify the one or more parameters affected by the editing of the instance of the parameterized cell is further to identify a list of shapes and parameters for the shapes affected by the editing, and call an editing function to implement the editing of the shapes.

20. The system of claim 16, in which the new parameter cell submaster comprises a smart shape or a fluid shape that is characterized by being capable of being visually edited.

21. The system of claim 16, in which the computer processor that is to create the new parameterized cell submaster is further to:
- specify existence and an identity of an implementation function for the new parameterized cell submaster; and
- provide information about the new parameterized cell submaster to an electronic design tool such that the electronic design tool is to be used to edit the new parameterized cell submaster.

22. The system of claim 16, the computer processor is further to:
- tag a shape in the new parameterized cell submaster with a tag; and
- identify one or more parameters of the new parameterized cell submaster based at least in part upon the tag.

* * * * *